United States Patent
Apel et al.

(10) Patent No.: US 6,459,340 B1
(45) Date of Patent: Oct. 1, 2002

(54) POWER AMPLIFIER MISMATCH PROTECTION WITH CLAMPING DIODES IN RF FEEDBACK CIRCUIT

(75) Inventors: Thomas R. Apel, Portland; James E. Bonkowski; Paul H. Litzenberg, both of Beaverton, all of OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 09/871,162

(22) Filed: May 31, 2001

(51) Int. Cl.[7] .................. H03F 3/04; H03F 21/00; H03F 1/36; H03G 3/12
(52) U.S. Cl. ............... 330/298; 330/207 P; 330/110; 330/282
(58) Field of Search ............... 330/207 P, 110, 330/282, 298

(56) References Cited

U.S. PATENT DOCUMENTS

| | | | | |
|---|---|---|---|---|
| 4,092,709 A | * | 5/1978 | Voigt et al. | 363/18 |
| 4,464,634 A | * | 8/1984 | Velazquez | 330/264 |
| 4,523,152 A | * | 6/1985 | Garde | 330/151 |
| 5,070,538 A | * | 12/1991 | Milberger et al. | 330/297 |
| 5,512,857 A | * | 4/1996 | Koskowich | 330/252 |

* cited by examiner

*Primary Examiner*—Patricia Nguyen
(74) *Attorney, Agent, or Firm*—Skjerven Morrill LLP; Christopher B. Allenby

(57) ABSTRACT

A set of clamping diodes between terminals of a transistor acting as a power amplifier is configured to allow overvoltage at the output terminal of the transistor to travel through those clamping diodes to provide feedback used by the transistor for gain control.

16 Claims, 1 Drawing Sheet

POWER AMPLIFIER MISMATCH PROTECTION WITH CLAMPING DIODES IN RF FEEDBACK CIRCUIT

FIELD OF THE INVENTION

This invention relates to power amplifiers, and more particularly to a circuit for protecting a transistor used as a power amplifier from overvoltage conditions at its output terminal.

BACKGROUND

The use of diodes between the collector terminal of a transistor and ground to provide over-voltage protection from electrostatic discharge (ESD) and some load is mismatch conditions is standard engineering practice. Preventing a buildup of excess collector voltage is important, because such excess collector voltage is one of the main causes of radio frequency (RF) power transistor burnout where mismatched loading or ESD is present. An RF signal handled by the power transistor is typically defined as an alternating current having a frequency above substantially 9 kHz.

A presently-known circuit 100 for protecting a transistor is shown in FIG. 1. The base terminal of a bipolar transistor 102 is connected to an input terminal 104, the collector terminal of the bipolar transistor 102 is connected to an output terminal 106, and the emitter terminal of the bipolar transistor 102 is connected to ground. The input terminal 104 and the output terminal 106 can be physical terminals, or simply arbitrary points on conductors leading to other electrical components. A filter 114 may be provided between the input terminal of the bipolar transistor 102 and the input terminal 104. Further, an inductor 116 may be connected at one end to a point in the circuit between the input terminal 104 and the filter 114 (or the bipolar transistor 102, if the filter 114 is not used), where the other end of the inductor 116 is connected to ground.

A diode array 108 is also connected to the collector terminal of the bipolar transistor 102. An inductor 118 may be connected from a voltage source to the collector terminal of the bipolar transistor 102 and the diode array 108. The inductor 118 acts to resist current flow from the voltage source to the diode array 108 or collector terminal of the bipolar transistor 102, while pulling up the voltage of the output terminal 106 during normal operation.

The diode array 108 includes a number of first diodes 110 connected in series, where the initial first diode 110 in series is connected to the collector terminal of the bipolar transistor 102 and the last first diode 110 in series is connected to ground. The first diodes 110 are each oriented toward ground. That is, the forward bias direction of each first diode 110 is away from the collector terminal of the bipolar transistor 102 and toward the ground. The activation voltage and voltage drop of each first diode 110, and the number of first diodes 110, are chosen such that a particular overvoltage at the collector terminal of the bipolar transistor 102 will cause a forward bias to be applied to all of the first diodes 110, thereby opening a path to ground through which the overvoltage can dissipate. In this way, the first diodes 110 protect the collector terminal of the bipolar transistor 102 from overvoltage conditions that can result from electrostatic discharge (ESD) or from impedance or voltage mismatch associated with a load connected to the output terminal 106.

Similarly, the diode array 108 includes a number of second diodes 112 connected in series, where the initial second diode 112 in series is connected to ground and the last second diode 112 in series is connected to the collector terminal of the bipolar transistor 102. The second diodes 112 are each oriented toward the collector terminal of the bipolar transistor 102. That is, the forward bias direction of each second diode 112 is toward the collector terminal of the bipolar transistor 102 and away from the ground. The set of serially-connected second diodes 112 is connected in parallel to the set of serially-connected first diodes 110. The activation voltage and voltage drop of each second diode 112, and the number of second diodes 112, are chosen such that a particular overvoltage at the collector terminal of the bipolar transistor 102 will cause a forward bias to be applied to all of the second diodes 112, thereby opening a path to ground through which the overvoltage can dissipate. Such overvoltage is a different polarity from the overvoltage that causes all of the first diodes 110 to open a path to ground. In this way, the second diodes 112 protect the collector terminal of the bipolar transistor 102 from overvoltage conditions that can result from electrostatic discharge (ESD) or from impedance or voltage mismatch associated with a load connected to the output terminal 106. The number of first diodes 110 and second diodes 112 is not necessarily equal, as overvoltage at a particular polarity may warrant more protection than overvoltage at the opposite polarity.

Thus, the diode array 108 allows at least some overvoltage to run to ground in order to protect the transistor 102. However, the continuing application of gain by the transistor 102 to a signal received at its base terminal from the input terminal 104 still may result in excess voltage at the collector terminal, and damage the transistor 102.

SUMMARY

A set of clamping diodes between terminals of a transistor acting as a power amplifier is configured to allow overvoltage at the output terminal of the transistor to travel through those clamping diodes to provide feedback used by the transistor for gain control.

In one aspect of the invention, two sets of clamping diodes are provided between the collector terminal and the base terminal of a bipolar transistor. A first set of clamping diodes are serially connected, and the forward bias of each clamping diode in the first set is oriented toward the base terminal. A second set of clamping diodes are serially connected, and the forward bias of each clamping diode in the second set is oriented toward the collector terminal. The first set of clamping diodes is connected in parallel to the second set. In this way, overvoltage at the collector resulting from ESD or load mismatch creates a forward bias on the set of clamping diodes oriented toward the base, allowing current to flow across those clamping diodes to provide feedback. The feedback reduces the input current applied to the base terminal of the transistor, reducing the overvoltage conditions at the collector terminal and protecting the transistor from damage.

In another aspect of the invention, two sets of clamping diodes are provided between the drain terminal and the gate terminal of a field effect transistor. A first set of clamping diodes are serially connected, and the forward bias of each clamping diode in the first set is oriented toward the gate terminal. A second set of clamping diodes are serially connected, and the forward bias of each clamping diode in the second set is oriented toward the drain terminal. The first set of clamping diodes is connected in parallel to the second set. In this way, overvoltage at the drain resulting from ESD or load mismatch creates a forward bias on the set of clamping diodes oriented toward the gate, allowing current to flow across those clamping diodes to provide feedback. The feedback reduces the input current applied to the gate terminal of the transistor, reducing the overvoltage conditions at the drain terminal and protecting the transistor from damage.

The invention will be more fully understood upon consideration of the detailed description below, taken together with the accompanying drawings.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1:
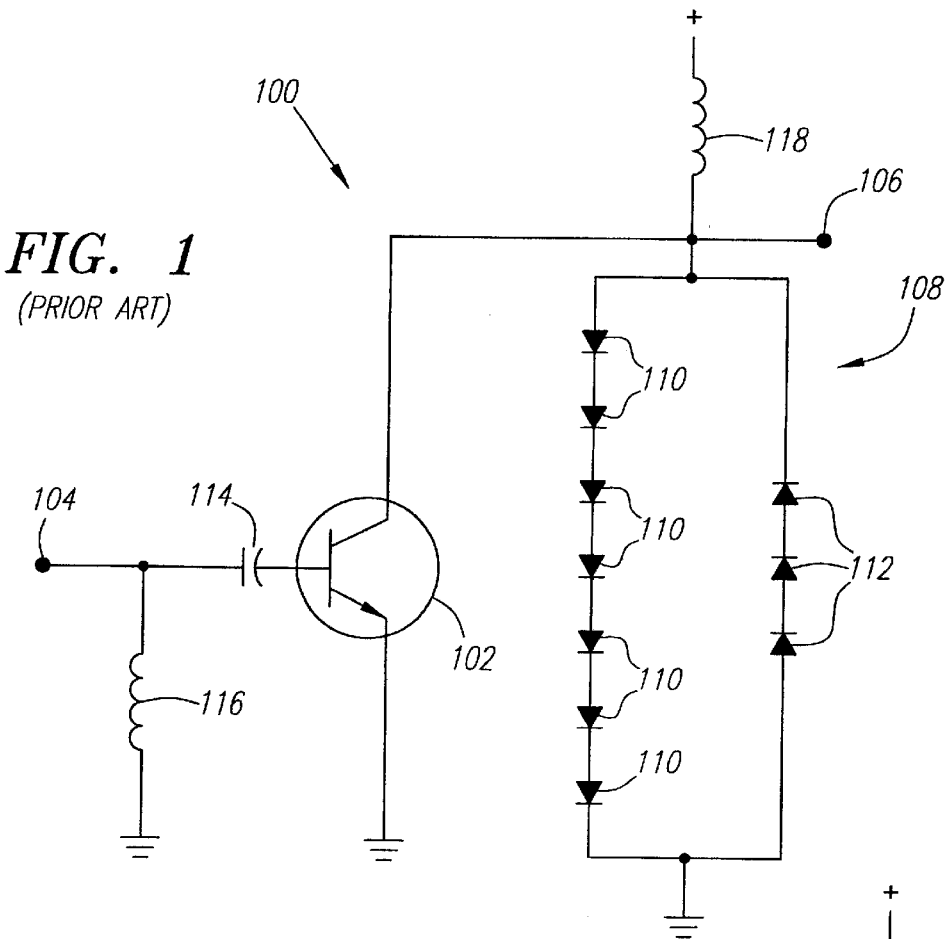
FIG. 1 is a schematic of a prior art overvoltage protection circuit.
Figure 2:
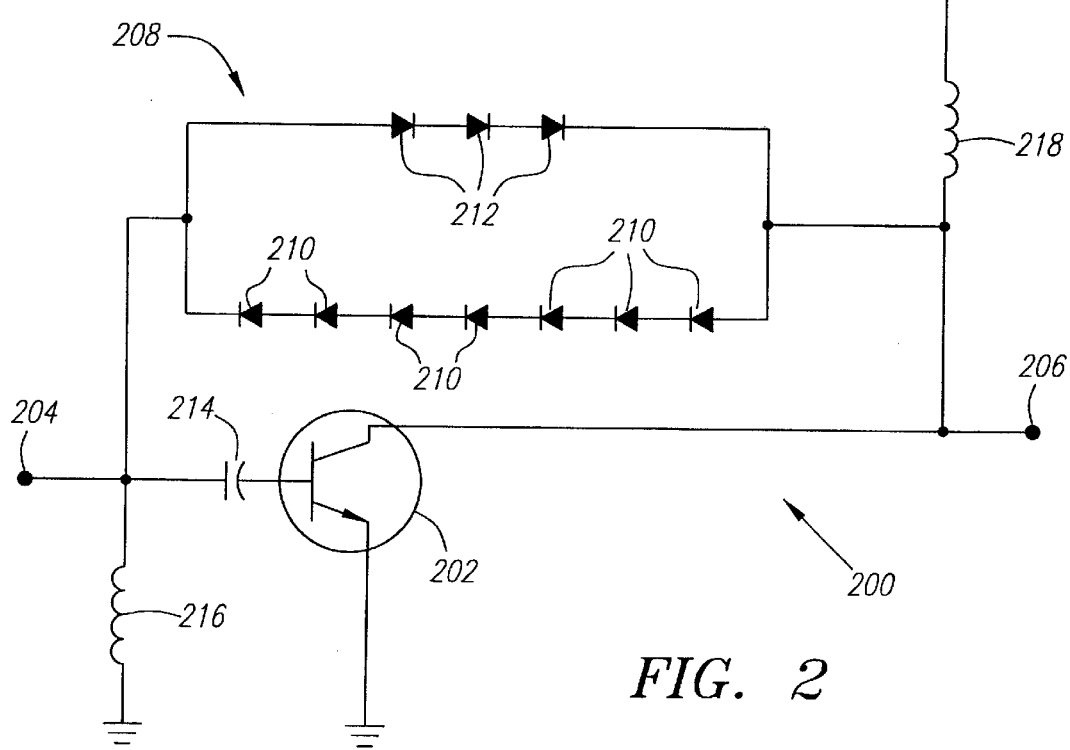
FIG. 2 is a schematic of one embodiment of an overvoltage protection circuit.

Referring to FIG. 2, a circuit 200 for protecting a power amplifier from overvoltage conditions at its output is shown. The base terminal of a bipolar transistor 202 is connected to an input terminal 204, the collector terminal of the bipolar transistor 202 is connected to an output terminal 206, and the emitter terminal of the bipolar transistor 202 is connected to ground. The input terminal 204 and the output terminal 206 can be physical terminals, or simply arbitrary points on conductors leading to other electrical components. A filter 214 may be provided between the input terminal of the bipolar transistor 202 and the input terminal 204. Further, an inductor 216 may be connected at one end to a point in the circuit between the input terminal 204 and the filter 214 (or the bipolar transistor 202, if the filter 214 is not used), where the other end of the inductor 216 is connected to ground.

A diode array 208 is connected at one end to the collector terminal of the bipolar transistor 202 and at the other end to the input terminal 204. An inductor 218 may be connected from a voltage source to one end of the collector terminal of the bipolar transistor 202 and one end of the diode array 208. The inductor 218 acts to resist current flow from the voltage source to the diode array 208 or collector terminal of the bipolar transistor 202, while pulling up the voltage of the output terminal 206 during normal operation.

The diode array 208 includes a number of first diodes 210 connected in series, where the initial first diode 210 in series is connected to the collector terminal of the bipolar transistor 202 and the last first diode 210 in series is connected to the input terminal 204. The first diodes 210 may be referred to as clamping diodes. The first diodes 210 are each oriented toward the input terminal 204. That is, the forward bias direction of each first diode 210 is away from the collector terminal of the bipolar transistor 202 and toward the input terminal 204. The activation voltage and voltage drop of each first diode 210, and the number of first diodes 210, are chosen such that a particular overvoltage at the collector terminal of the bipolar transistor 202 will cause a forward bias to be applied to all of the first diodes 210, thereby opening a path to the input terminal. In one embodiment, each first diode 210 has an activation voltage of substantially 0.7V, and a voltage drop across the activated diode in the forward bias direction of substantially 1.25–1.3V. In one embodiment, the activation voltage of each first diode 210 and the voltage drop across each first diode 210 is the same. However, the activation voltages and voltage drops may be different at different first diodes 210, if desired.

Similarly, the diode array 208 includes a number of second diodes 212 connected in series, where the initial second diode 212 in series is connected to the input terminal 204 and the last second diode 212 in series is connected to the collector terminal of the bipolar transistor 202. The second diodes 212 also may be referred to as clamping diodes. The second diodes 212 are each oriented toward the collector terminal of the bipolar transistor 202. That is, the forward bias direction of each second diode 212 is toward the collector terminal of the bipolar transistor 202 and away from the input terminal 204. The set of serially-connected second diodes 212 is connected in parallel to the set of serially-connected first diodes 210. The activation voltage and voltage drop of each second diode 212, and the number of second diodes 212, are chosen such that a particular overvoltage at the collector terminal of the bipolar transistor 202 will cause a forward bias to be applied to all of the second diodes 212, thereby opening a path to the input terminal 204. Such overvoltage is a different polarity from the overvoltage that causes all of the first diodes 210 to open a path to ground. The number of first diodes 210 and second diodes 212 is not necessarily equal, as overvoltage at a particular polarity may warrant more protection than overvoltage at the opposite polarity. Further, the number and the size of the second diodes 212 are chosen such that normal input voltages do not open all of the second diodes 212. In this way, the signal from the input terminal 204 does not bypass the bipolar transistor 202 during normal operation of the circuit 200. In one embodiment, the activation voltage of each second diode 212 and the voltage drop across each second diode 212 is the same, and is the same as the activation voltage and the voltage drop across each first diode 210. However, the activation voltages and voltage drops may be different at different second diodes 212, if desired. In one embodiment, each second diode 212 has an activation voltage of substantially 0.7V, and a voltage drop across the activated diode in the forward bias direction of substantially 1.25–1.3V.

While the transistor 202 is described above as a bipolar transistor, one skilled in the art will recognize that a field effect transistor may be used instead, where that field effect transistor has analogous gate, source and drain terminals. The field effect transistor operates in a similar manner as the bipolar transistor in the circuit 200, and is protected by the diode array 208 in the same manner as a bipolar transistor. Thus, all references in this document to a bipolar transistor and/or its terminals refer equally to a field effect transistor and/or its analogous terminals.

During normal operation of the circuit 200, current is not transmitted through the diode array 208. To operate the circuit 200, current and voltage are applied to the base terminal of the bipolar transistor 202. This current and voltage are characteristics of an RF input signal received through the input terminal 204, via the filter 216 (if utilized). As the current applied to the base terminal increases, the current at the collector 206 of the bipolar transistor 202 increases. The increase in current between the base terminal and the collector terminal of the bipolar transistor 202 is the gain of that bipolar transistor 202. Correspondingly, the voltage at the collector terminal of the bipolar transistor 202 increases as the current applied to the base terminal increases. In this way, a signal received at the base terminal of the bipolar transistor 202 is amplified and transmitted to the output terminal 206.

An overvoltage condition at the collector terminal of the bipolar transistor 202 is undesirable, because it can damage the transistor 202. An overvoltage condition may be caused by ESD, or by a mismatched load connected to the output terminal 206. A mismatched load can reflect voltage back from the load to the collector terminal, creating an overvoltage condition.

When an overvoltage condition is present at the collector terminal of the bipolar transistor, it is also present at the entrance of the diode array 208. The entrance of the diode array 208 is defined as the location in the diode array 208 connected to the collector terminal of the bipolar transistor 202. The overvoltage is applied to both the first diode 210 and the second diode 212 connected to the entrance of the diode array 208. Depending on the polarity of the overvoltage condition, one or the other of those diodes 210, 212 adjacent to the entrance of the diode array 208 receives a forward bias voltage. If the overvoltage condition is large enough, the appropriate diode 210, 212 is activated, and current travels through it, experiencing a voltage drop through the diode 210, 212. The other diode 210, 212 does not change its state, remaining in an open-circuit configuration.

For clarity in describing the diode array 208, the polarity of the overvoltage condition is assumed to be such that the first diode 210 adjacent to the entrance of the diode array 208 is the diode activated above, and the second diodes 212 remain in an open-circuit configuration. The first diode 210 downstream from the diode 210 that has been activated above now has a voltage applied to it. This voltage is substantially equal to the overvoltage at the collector terminal of the transistor 202, minus the voltage drop experienced across the first diode 210 adjacent to the entrance of the diode array 208. As with the first diode 210 adjacent to the entrance of the diode array 208, the next first diode 210 is itself activated if the voltage applied to it is large enough, and current travels through it, experiencing a voltage drop across the diode 210.

The remaining first diodes 210 in sequence are in turn activated if the voltage applied to each one is high enough, and voltage drops across each activated first diode 210. If the overvoltage value is high enough, all of the first diodes 210 are activated, and an electrical path is opened across the diode array 208. A feedback signal current then flows to the input terminal 204 across the diode array 208. The feedback signal is an RF signal.

The characteristics of the circuit path over which the feedback signal travels, such as the length of the circuit path and the properties of the diodes 210, 212 and bipolar transistor 202, are chosen such that the RF feedback signal is out of phase with the RF input signal received through the input terminal 204. Because the RF feedback signal current is out of phase with the RF input signal current, destructive interference occurs between them, decreasing the magnitude of the RF input signal. Consequently, the current applied to the base terminal of the transistor 202 is reduced from the amount that was previously applied. Therefore, the gain of the transistor 202 is reduced. The reduced gain results in a lower voltage at the collector terminal of the transistor 202. Thus, the diode array 208 not only dissipates overvoltage at the collector terminal of the transistor 202, but also provides negative feedback to the transistor 202 to reduce the voltage at the collector terminal resulting from normal operation of the transistor 202. The second diodes 212 are chosen such that this lower voltage condition does not activate a path back to the entrance of the diode array 208 via the second diodes 212.

If the overvoltage condition at the collector terminal of the transistor 202 is the opposite polarity than described above, the operation of the diode array 208 is the same as described above, with the exception that the second diodes 212 are utilized to open a path across the diode array 208 instead of the first diodes 210.

Although the invention has been described with reference to particular embodiments, the description is only an example of the invention's application and should not be taken as a limitation. Consequently, various adaptations and combinations of features of the embodiments disclosed are within the scope of the invention as defined by the following claims and their legal equivalents.

What is claimed is:

1. An electronic circuit for overvoltage protection, the circuit used in conjunction with a radio frequency input signal source and a load, the circuit comprising:
   a bipolar transistor comprising
      a base terminal connected to the input signal source,
      a collector terminal connected to the load, and
      an emitter terminal connected to ground; and
   a diode array connecting said base terminal and said collector terminal, said diode array comprising
      a plurality of serially-connected first diodes forming a first set, and
      a plurality of serially-connected second diodes forming a second set,
      said second set connected in parallel to said first set.

2. The circuit of claim 1, wherein each said first diode has a forward bias direction oriented toward said base terminal and each said second diode has a forward bias direction oriented toward said collector terminal.

3. The circuit of claim 1, wherein the number of said first diodes is different from the number of said second diodes.

4. The circuit of claim 1, wherein each said first diode and each said second diode has a substantially equal activation voltage.

5. The circuit of claim 1, wherein the voltage drop across each said first diode and each said second diode is substantially equal.

6. The circuit of claim 1, further comprising:
   a first inductor connected to a voltage source and to said diode array; and
   a second inductor connected to ground and to said diode array.

7. The circuit of claim 1, further comprising a filter electrically connected to said base terminal of said bipolar transistor, between said diode array and said base terminal of said bipolar transistor.

8. An electronic circuit for overvoltage protection, the circuit used in conjunction with
   a radio frequency input signal source and a load, the circuit comprising:
   a field effect transistor comprising
      a gate terminal connected to the input signal source,
      a drain terminal connected to the load, and
      a source terminal connected to ground; and
   a diode array connecting said gate terminal and said drain terminal, said diode array comprising
      a plurality of serially-connected first diodes forming a first set, and
      a plurality of serially-connected second diodes forming a second set,
      said second set connected in parallel to said first set.

9. The circuit of claim 8, wherein each said first diode has a forward bias direction oriented toward said gate terminal and each said second diode has a forward bias direction oriented toward said drain terminal.

10. The circuit of claim 8, wherein the number of said first diodes is different from the number of said second diodes.

11. The circuit of claim 8, wherein each said first diode and each said second diode has a substantially equal activation voltage.

12. The circuit of claim 8, wherein the voltage drop across each said first diode and each said second diode is substantially equal.

13. The circuit of claim 8, further comprising:
   a first inductor connected to a voltage source and to said diode array; and
   a second inductor connected to ground and to said diode array.

14. The circuit of claim 8, further comprising a filter electrically connected to said gate terminal of said field effect transistor, between said diode array and said gate terminal of said field effect transistor.

15. A method for controlling a transistor used for power amplification, comprising:
   providing a bipolar transistor, comprising
      a base terminal connected to the source of the input signal,
      a collector terminal connected to the load, and
      an emitter terminal connected to ground;
   providing a diode array connecting said base terminal and said collector terminal, said diode array comprising
      a plurality of serially-connected first diodes forming a first set, and
      a plurality of serially-connected second diodes forming a second set, said second set connected in parallel to said first set,
   applying a radio frequency input signal to said base terminal;
   receiving overvoltage at said collector terminal; and
   opening an electrical path through said diode array, wherein a radio frequency feedback signal out of phase with said input signal flows from said collector terminal through said diode array such that the combination of said feedback signal with said input signal reduces the current of said input signal, wherein said gain of said transistor is reduced.

16. The method of claim 15, further comprising providing a filter between said base terminal and said diode array, wherein said voltage is applied to said base terminal from said diode array via said filter.

* * * * *